US011955526B2

(12) United States Patent
Xie et al.

(10) Patent No.: US 11,955,526 B2
(45) Date of Patent: Apr. 9, 2024

(54) THICK GATE OXIDE DEVICE OPTION FOR NANOSHEET DEVICE

(71) Applicant: INTERNATIONAL BUSINESS MACHINES CORPORATION, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 17/304,112

(22) Filed: Jun. 15, 2021

(65) Prior Publication Data

US 2022/0399450 A1   Dec. 15, 2022

(51) Int. Cl.
*H01L 27/12*   (2006.01)
*H01L 21/02*   (2006.01)
(Continued)

(52) U.S. Cl.
CPC .. *H01L 29/42392* (2013.01); *H01L 21/02532* (2013.01); *H01L 21/0259* (2013.01);
(Continued)

(58) Field of Classification Search
CPC ......... H01L 29/42392; H01L 21/02532; H01L 21/0259; H01L 29/0665; H01L 29/66553;
(Continued)

(56) References Cited

U.S. PATENT DOCUMENTS 9,954,058 B1 * 4/2018 Mochizuki ........ H01L 29/42392
9,960,232 B2   5/2018 Obradovic
(Continued)

FOREIGN PATENT DOCUMENTS

JP   4864987 B2   7/2010
TW   202121541 A   6/2021
WO   2022262462 A1   12/2022

OTHER PUBLICATIONS

Notification of Transmittal of the International Search Report and the Written Opinion of the International Searching Authority, or the Declaration, dated Jul. 27, 2022, Applicant's or agent's file reference EIE220334PCT, International application No. PCT/CN2022/091486, 9 pages.

(Continued)

*Primary Examiner* — Niki H Nguyen
(74) *Attorney, Agent, or Firm* — Samuel A. Waldbaum (57) ABSTRACT

An apparatus comprising a substrate and a thin gate oxide nanosheet device located on the substrate, having a first plurality of nanosheet layers, wherein each of the first plurality of nanosheet layers has a first thickness located at the center of the nanosheet. A thick gate oxide nanosheet device located on the substrate, having a second plurality of nanosheet layers, wherein each of the second plurality of nanosheet layers has a second thickness and wherein the first thickness is less than the second thickness.

17 Claims, 12 Drawing Sheets

(51) Int. Cl.
  *H01L 29/06* (2006.01)
  *H01L 29/423* (2006.01)
  *H01L 29/66* (2006.01)
  *H01L 29/786* (2006.01)

(52) U.S. Cl.
  CPC .... *H01L 29/0665* (2013.01); *H01L 29/66553* (2013.01); *H01L 29/66742* (2013.01); *H01L 29/78696* (2013.01); H01L 2029/42388 (2013.01)

(58) Field of Classification Search
  CPC ......... H01L 29/66742; H01L 29/78696; H01L 2029/42388; H01L 21/0245; H01L 21/02507; H01L 29/165; H01L 29/7848; H01L 29/66545; H01L 29/775; H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365; H01L 29/7855–7856; H01L 29/66431; H01L 29/66462; H01L 29/778; H01L 21/8249; H01L 29/435; H01L 29/7832; H01L 29/8126; H01L 31/1123; H01L 2924/13063; H01L 29/66848–66886; H01L 21/823412; H01L 21/823807; H01L 27/14616; H01L 29/66651; H01L 29/66659; H01L 29/7725; H01L 29/0843–0891; H01L 29/7833–7836; H01L 29/66575–66598; H01L 29/6659; H01L 29/66636; H01L 29/66643; H10B 12/36; H10B 12/056; Y10S 977/938
  See application file for complete search history.

(56) References Cited

U.S. PATENT DOCUMENTS

| | | |
|---|---|---|
| 10,014,389 B2 | 7/2018 | Ruilong |
| 10,014,390 B1 | 7/2018 | Bouche |
| 10,141,403 B1 | 11/2018 | Cheng |
| 10,229,971 B1 | 3/2019 | Cheng |
| 10,243,054 B1 | 3/2019 | Cheng |
| 10,515,859 B2 | 12/2019 | Doris |
| 10,566,443 B2 | 2/2020 | Cheng |
| 10,700,064 B1 | 6/2020 | Zhang |
| 10,741,660 B2 | 8/2020 | Loubet |
| 10,833,191 B2 | 11/2020 | Frougier |
| 2018/0254322 A1 | 9/2018 | Cheng |
| 2019/0122937 A1 | 4/2019 | Cheng |
| 2019/0198400 A1 | 6/2019 | Miao |
| 2019/0287864 A1 | 9/2019 | Cheng |
| 2020/0066839 A1* | 2/2020 | Zhang ............ H01L 21/823412 |
| 2020/0168715 A1* | 5/2020 | Wu ...................... H01L 27/088 |
| 2020/0357911 A1* | 11/2020 | Frougier ........... H01L 29/42392 |
| 2020/0411667 A1* | 12/2020 | Wong ................. H01L 29/0653 |
| 2021/0043727 A1* | 2/2021 | Frougier ........... H01L 29/66553 |
| 2022/0037315 A1* | 2/2022 | Chuang .......... H01L 21/823481 |

OTHER PUBLICATIONS

TW Office Action, dated Dec. 26, 2022, 12 pages.
Taiwan Intellectual Property Office, Ministry of Economics Affairs, "Notification of Office Action dated Jul. 7, 2023", Taiwan Application No. 111112430, filed Mar. 31, 2022, 5 pgs.

* cited by examiner

FIG. 6A  FIG. 6B  FIG. 6C

THICK GATE OXIDE DEVICE OPTION FOR NANOSHEET DEVICE

BACKGROUND

The present invention relates generally to the field of nanosheets, and more particularly to concurrently forming a thick gate oxide device and a thin gate oxide nanosheet device on the same substrate.

Gate-all-around devices, such as, Nanosheet Field-Effect-Transistors (FETs) are becoming a technology of increasing importance. Research and development have been focusing on the formation of standalone Gate-all-around nanosheet devices.

BRIEF SUMMARY

Additional aspects and/or advantages will be set forth in part in the description which follows and, in part, will be apparent from the description, or may be learned by practice of the invention.

An apparatus comprising a substrate and a thin gate oxide nanosheet device located on the substrate, having a first plurality of nanosheet layers, wherein each of the first plurality of nanosheet layers has a first thickness located at the center of the nanosheet. A thick gate oxide nanosheet device located on the substrate, having a second plurality of nanosheet layers, wherein each of the second plurality of nanosheet layers has a second thickness and wherein the first thickness is less than the second thickness.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic.

Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. The present invention is directed towards the concurrent formation of a thin gate oxide nanosheet device and the formation of a thick gate oxide device on the same substrate. The thin gate oxide nanosheet device is formed by thinning specific layers of the nanosheet during fabrication. Furthermore, the thickness of the thick gate oxide device is maintained during the thinning process (e.g., the nanosheet layers thickness does not change).

Figure 1A:
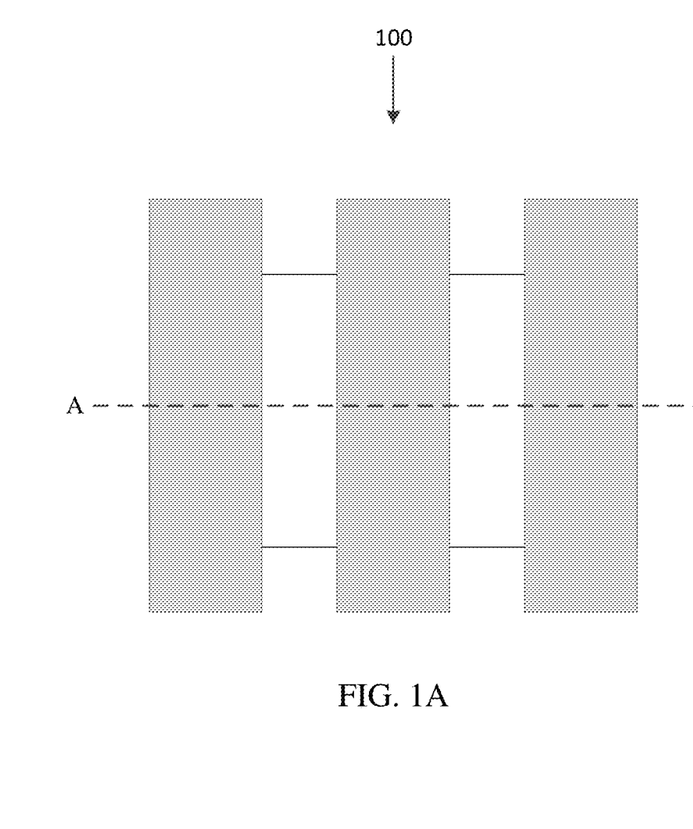
FIG. 1A illustrates a thin gate oxide nanosheet device, in accordance with an embodiment of the present invention.
Figure 1B:
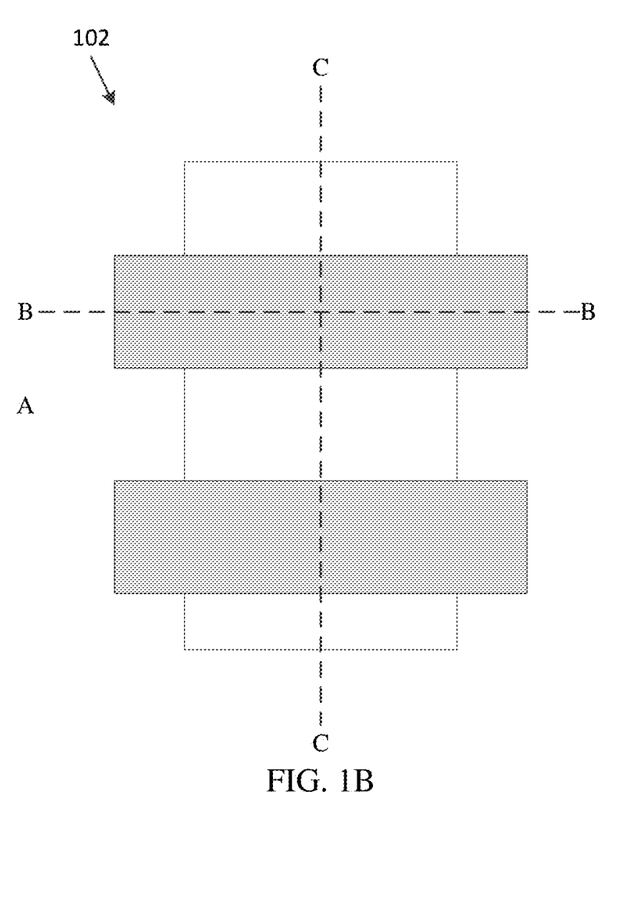
FIG. 1B illustrates a thick gate oxide device formed on the same substrate as the thin gate oxide nanosheet device, in accordance with the embodiment of the present invention.

FIG. 1A illustrates a thin gate oxide nanosheet device 100, in accordance with an embodiment of the present invention. FIG. 1B illustrates a thick gate oxide device 102 formed on the same substrate as the thin gate oxide nanosheet device 100, in accordance with the embodiment of the present invention. The Figures that have an "A" in the figure number illustrate a cross section of the thin gate oxide nanosheet device 100. The Figures that have a "B" or "C" in the figure number illustrate a cross section of the thick gate oxide device 102.

Figure 2A:
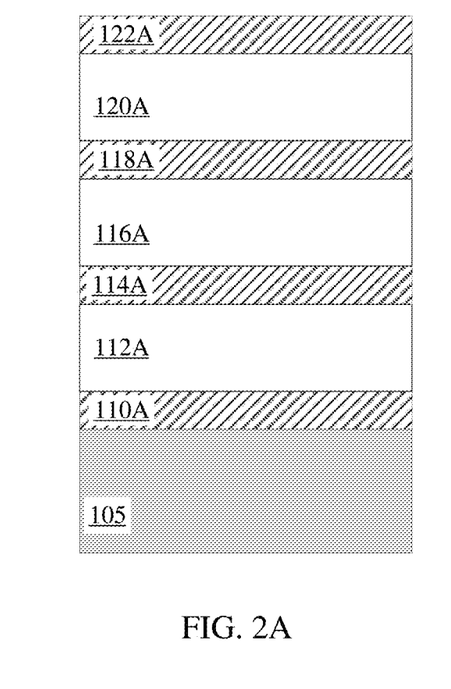
FIGS. 2A, 2B, and 2C each illustrate a different cross section of the devices on the same substrate during a fabrication stage, in accordance with an embodiment of the present invention.
Figure 2B:
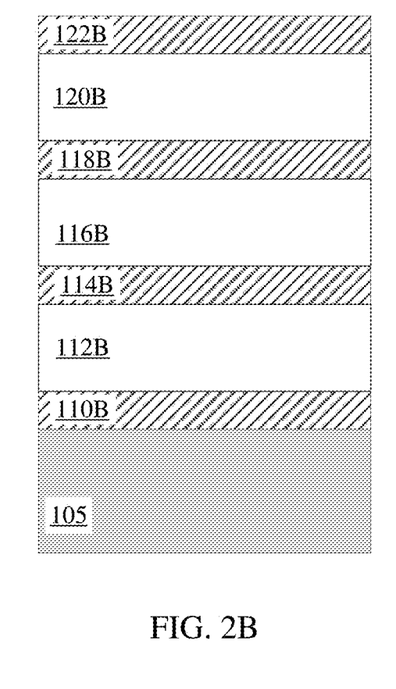
Figure 2C:
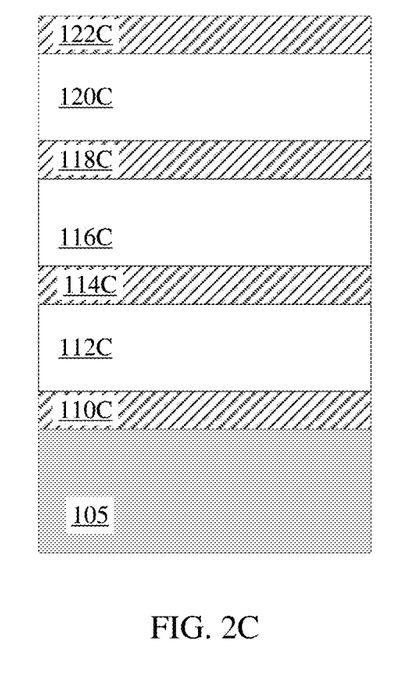

FIGS. 2A, 2B, and 2C each illustrate a different cross section of the devices on the same substrate during a fabrication stage, in accordance with an embodiment of the present invention. Multiple layers are formed on a substrate 105 to create a nanosheet stack, wherein the substrate 105 can be, for example, a silicon wafer, a sapphire wafer, metallic layer, a dielectric layer, an insulator layer, or any type of layer that is suitable for the formation of the thin gate oxide nanosheet device 100 and thick gate oxide device 102. Both devices are formed on the same substrate 105. FIG. 2A represents cross section A as identified in FIG. 1A, FIG. 2B represents cross section B as identified in FIG. 1B, and FIG. 2C represents cross section C as identified in FIG. 1B. The nanosheet stack is comprised of a plurality of alternating layers, while the number of alternating layers described herein is for exemplary purposes only. The nanosheet stack can have more or fewer alternating layers than what is shown. A first layer 110A, 110B, 110C is formed on top of the substrate 105. The first layer 110A, 110B, 110C is a sacrificial layer that can be, for example, SiGe30 and has a thickness in the range of about 3 to 8 nm. A second layer 112A, 112B, 112C is formed on top of the first layer 110A, 110B, 110C. The second layer 112A, 112B, 112C can be, for example, an epaxially grown layer of Si or another suitable material and has a thickness in the range of about 10 to 15 nm. A third layer 114A, 114B, 114C is formed on top of the second layer 112A, 112B, 112C. The third layer 114A, 114B, 114C is a sacrificial layer that can be, for example, SiGe30 and has a thickness in the range of about 3 to 8 nm. A fourth layer 116A, 116B, 116C is formed on top of the third layer 114A, 114B, 114C. The fourth layer 116A, 116B, 116C can be, for example, an epaxially grown layer of Si or another suitable material and has a thickness in the range of about 10 to 15 nm. A fifth layer 118A, 118B, 118C can be formed on top of the fourth layer 116A, 116B, 116C. The fifth layer 118A, 118B, 118C is a sacrificial layer that can be, for example, SiGe30 and has a thickness in the range of about 3 to 8 nm. A sixth layer 120A, 120B, 120C is formed on top of the fifth layer 118A, 118B, 118C. The sixth layer 120A, 120B, 120C can be, for example, an epaxially grown layer of Si or another suitable material and has a thickness in the range of about 10 to 15 nm. A seventh layer 122A, 122B, 122C is formed on top of the sixth layer 120A, 120B, 120C. The seventh layer 122A, 122B, 122C is a sacrificial layer that can be, for example, SiGe30 and has a thickness in the range of about 3 to 8 nm.

Figure 3A:
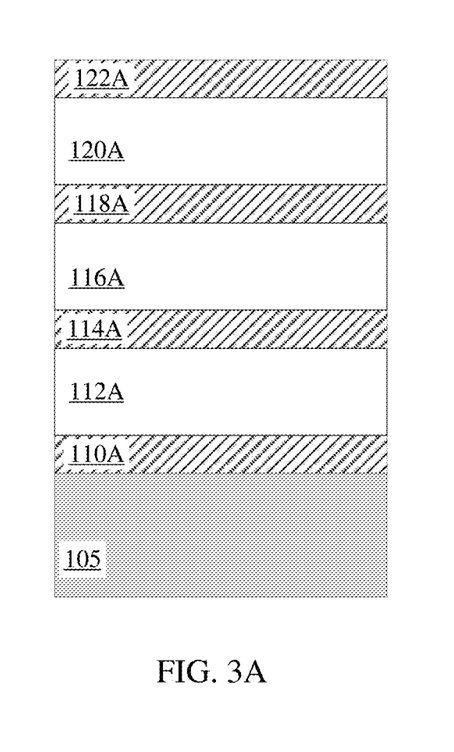
FIGS. 3A, 3B, and 3C each illustrate a different cross section of the devices on the same substrate during a fabrication stage, in accordance with an embodiment of the present invention.
Figure 3B:
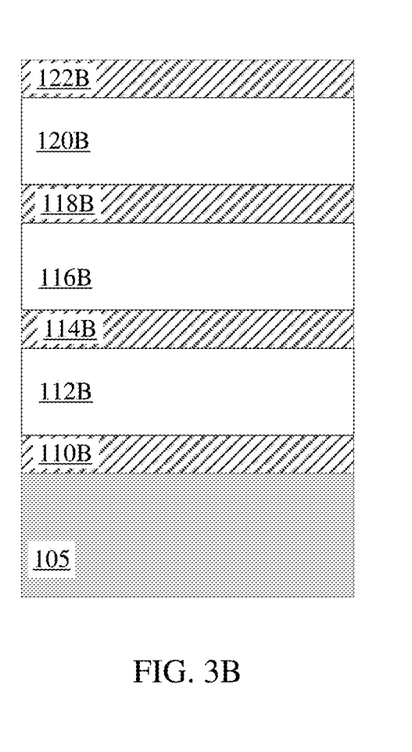
Figure 3C:
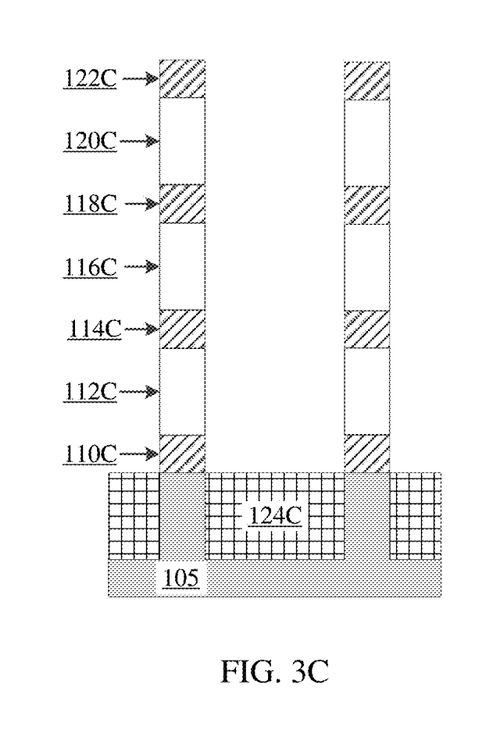

FIGS. 3A, 3B, and 3C each illustrate a different cross section of the devices on the same substrate during a fabrication stage, in accordance with an embodiment of the present invention.

The layers of FIGS. 3A and 3B are not processed at this stage. The layers in FIG. 3C are etched to form at least one fin. FIG. 3C illustrates the formation of two fins for illustrative purposes only. A single fin or a plurality of fins can be formed based on the design for the final product. During the etching of the fins for the device, the substrate 105 is etched causing trenches to be formed in the substrate 105. The trenches are filled in with a trench filler 124C. The trench filler 124C can be comprised of a shallow trench isolation material. The trench filler 124C fills the formed trenches in the substrate 105 and extends up to the bottom of the first layer 110C. The trench filler 124C can be formed by depositing a thin SiN followed by SiO2 bulk fill, followed by CMP and recess.

Figure 4A:
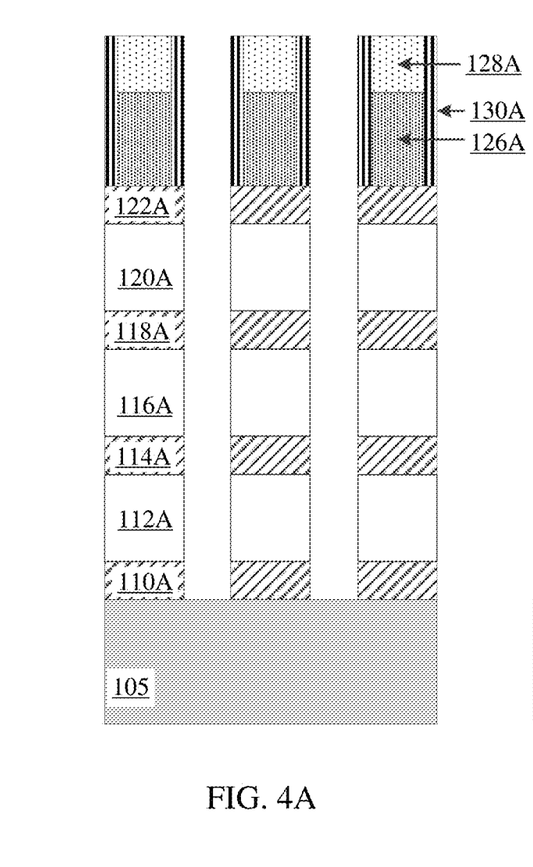
FIGS. 4A, 4B, and 4C each illustrate a different cross section of the devices on the same substrate during a fabrication stage, in accordance with an embodiment of the present invention.
Figure 4B:
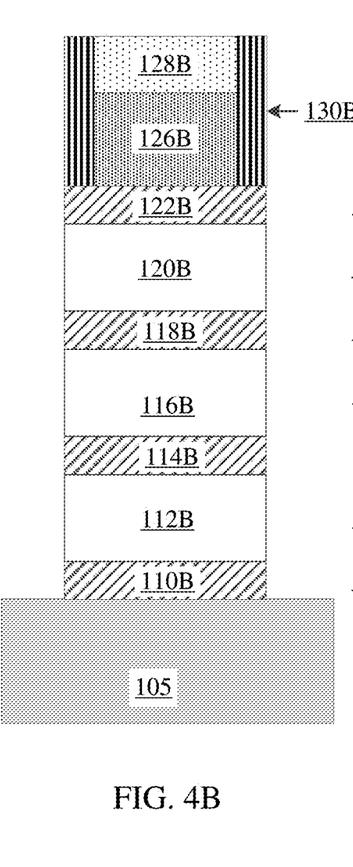
Figure 4C:
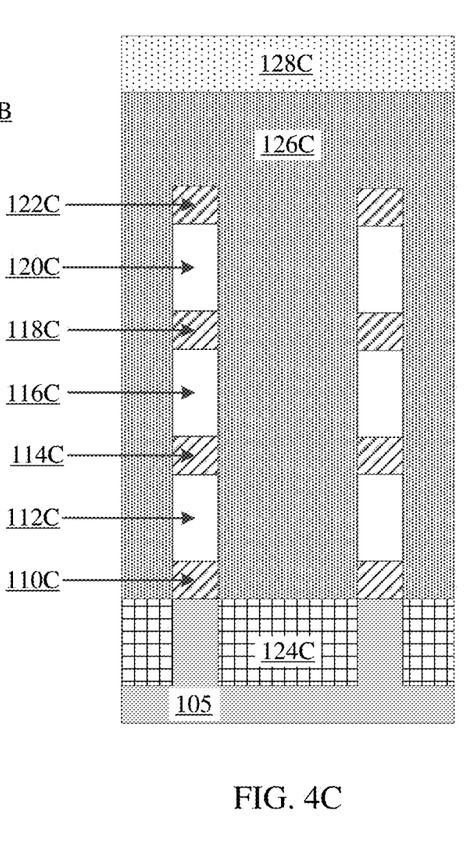

FIGS. 4A, 4B, and 4C each illustrate a different cross section of the devices on the same substrate during a fabrication stage, in accordance with an embodiment of the present invention.

FIG. 4A illustrates the initial formation of the thin gate oxide nanosheet device 100. A dummy gate 126A is formed on top of the seventh layer 122A. A hard mask 128A is formed on top of the dummy gate 126A and the device is etched to form at least one column. FIG. 4A illustrates the formation of three columns, but there can be fewer or more columns formed for the thin gate oxide nanosheet device 100. A spacer 130A is formed on the sides of the dummy gate 126A and the sides of the hard mask 128A, where the spacer 130A is formed on top of the seventh layer 122A. The spacer 130A can be selected from a group consisting of SiBCN, SiOCN, SiN, or a similar material. FIG. 4B illustrates the formation of a portion of the thick gate oxide device 102. The dummy gate 126B is formed on top of the seventh layer 122B and the hard mask 128B is formed on top of the dummy gate 126B. The layers are etched to form a column of the desired width as illustrated by FIG. 4B. The spacer 130B is formed on the sides of the dummy gate 126B and the sides of the hard mask 128B. The spacer 130B is formed on top of the seventh layer 122B. The spacer 130B can be selected from a group consisting of SiBCN, SiOCN, SiN, or a similar material. FIG. 4C illustrates the fins being enclosed by the dummy gate 126C. The dummy gate 126C is formed on top of the trench filler 124C, on top of the seventh layer 122C, and along the side walls of each of the fins to enclose each of the fins as illustrated by FIG. 4C. The hard mask 128C is formed on top of the dummy gate 126C. The dummy gate 126A, 126B, 126C can be comprised of a thin SiO2 liner followed by bulk material such as amorphous Si. As illustrated by FIG. 4A the thin gate oxide nanosheet devices 100 are short channel devices where gate length is short. As illustrated by FIGS. 4B and 4C the thick gate oxide device 102 is a long channel device where gate length is longer.

Figure 5A:
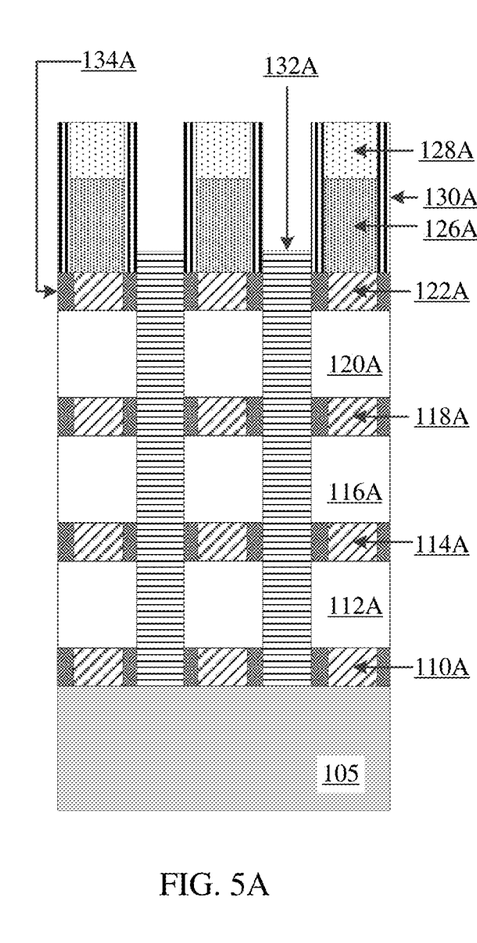
FIGS. 5A, 5B, and 5C each illustrate a different cross section of the devices on the same substrate during a fabrication stage, in accordance with an embodiment of the present invention.
Figure 5B:
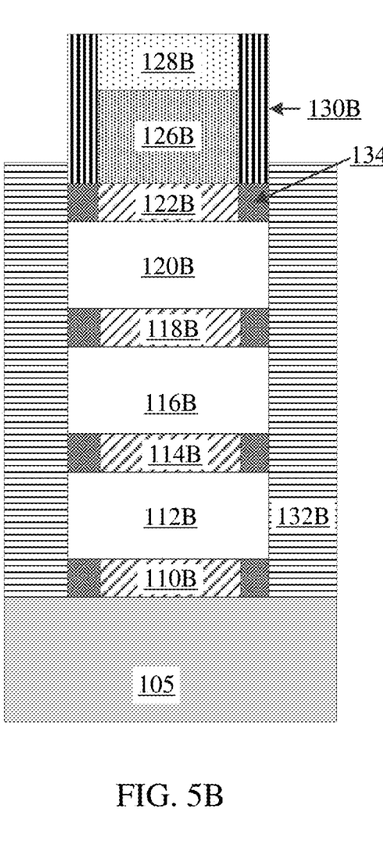
Figure 5C:
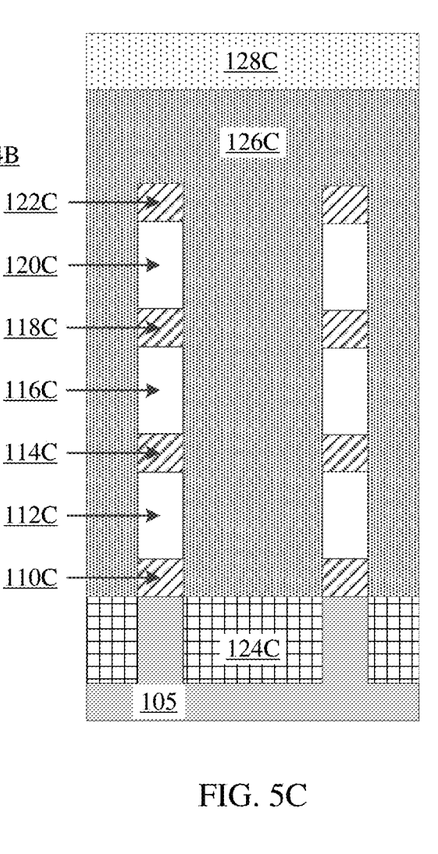

FIGS. 5A, 5B, and 5C each illustrate a different cross section of the devices on the same substrate during a fabrication stage, in accordance with an embodiment of the present invention. The first layer 110A, the third layer 114A, a fifth layer 118A and the seventh layer 122A are etched/recessed to form an open cavity. The open cavity is filled with a second spacer 134A (inner spacer) followed by an isotropic etch back of the spacer liner such that the second spacer 134A is located on the sides of the first layer 110A, the third layer 114A, a fifth layer 118A, and the seventh layer 122A. An epi layer 132A is formed between each of the columns as illustrated by FIG. 5A. The epi layer 132 can be, for example, epitaxially grown heavily doped Si or SiGe. As illustrated by FIG. 5B an epi layer 132B is formed on top of the exposed substrate 105 and the exposed sidewall of the second layer 112B, the fourth layer 116B, and the sixth layer 120B.

Figure 6A:
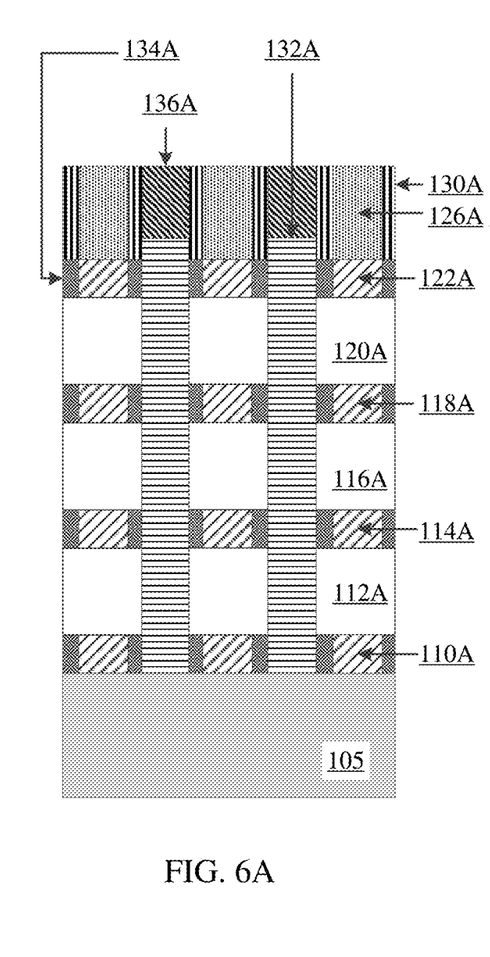
FIGS. 6A, 6B, and 6C each illustrate a different cross section of the devices on the same substrate during a fabrication stage, in accordance with an embodiment of the present invention.
Figure 6B:
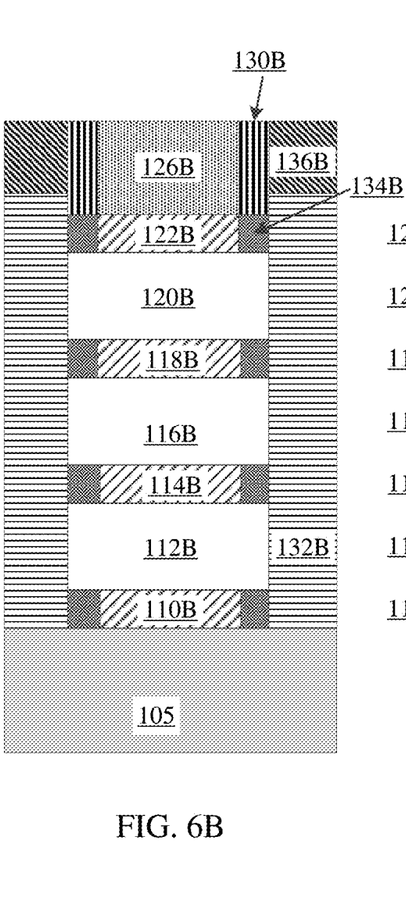
Figure 6C:
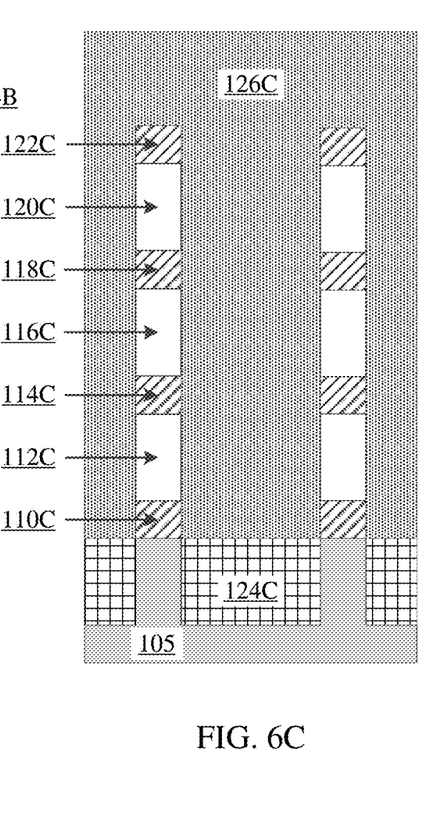

FIGS. 6A, 6B, and 6C each illustrate a different cross section of the devices on the same substrate during a fabrication stage, in accordance with an embodiment of the present invention. As illustrated by FIG. 6A, a dielectric layer 136A is formed on top of the epi layer 132A. The hard mask 128A and a portion of the spacer 130A is planarized to expose the dummy gate 126A. As illustrated by FIG. 6B, a dielectric layer 136B is formed on top of the epi layer 132B. The top surface is planarized to remove the hard mask 128B and to expose the dummy gate 126B. As illustrated by FIG. 6C, the top surface is planarized to remove the hard mask 128C and to expose the top surface of the dummy gate 126C.

Figure 7A:
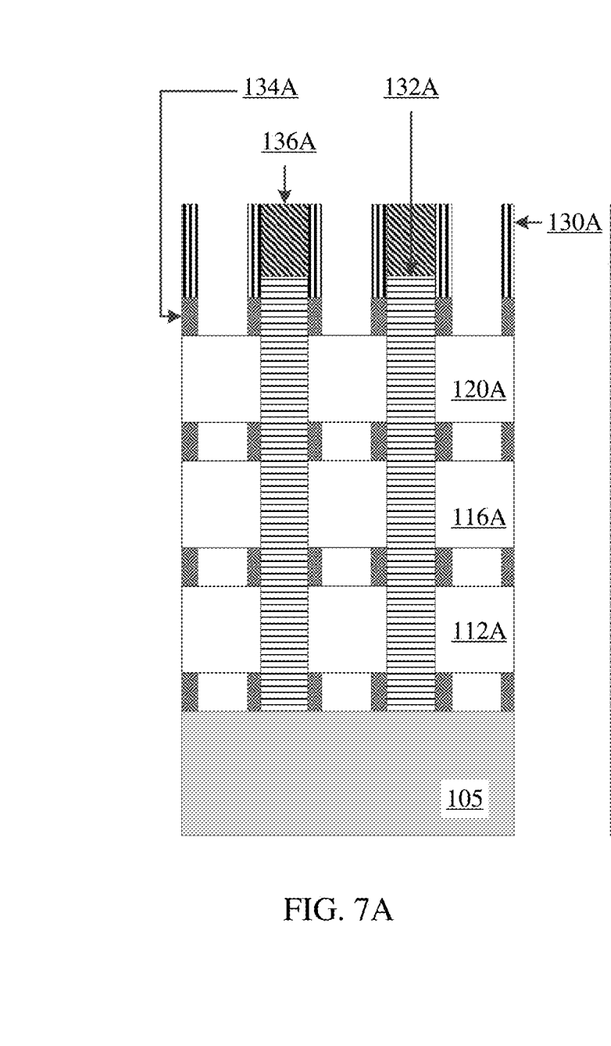
FIGS. 7A, 7B, and 7C each illustrate a different cross section of the devices on the same substrate during a fabrication stage, in accordance with an embodiment of the present invention.
Figures 7B, 7C:
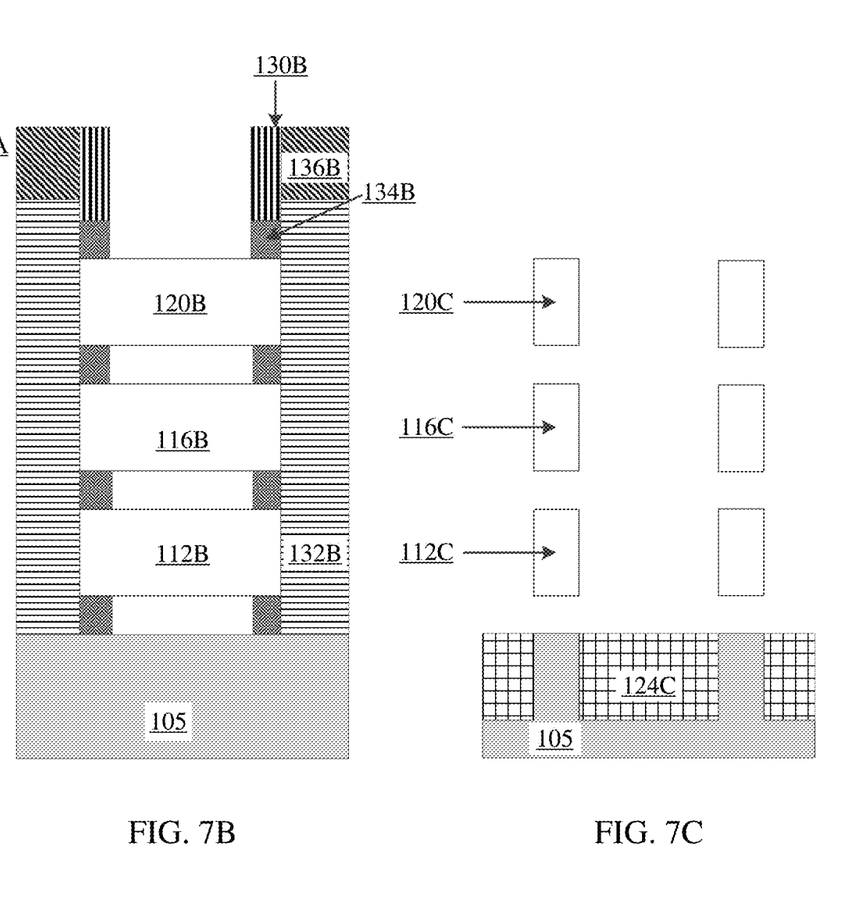

FIGS. 7A, 7B, and 7C each illustrate a different cross section of the devices on the same substrate during a fabrication stage, in accordance with an embodiment of the present invention. FIGS. 7A, 7B and 7C illustrate the removal of the dummy gate 126A, 126B, 126C and the removal of the first layer 110A, 110B, 110C, the third layer 114A, 114B, 114C, the fifth layer 118A, 118B, 118C, and the seventh layer 122A, 122B, 122C.

Figure 8A:
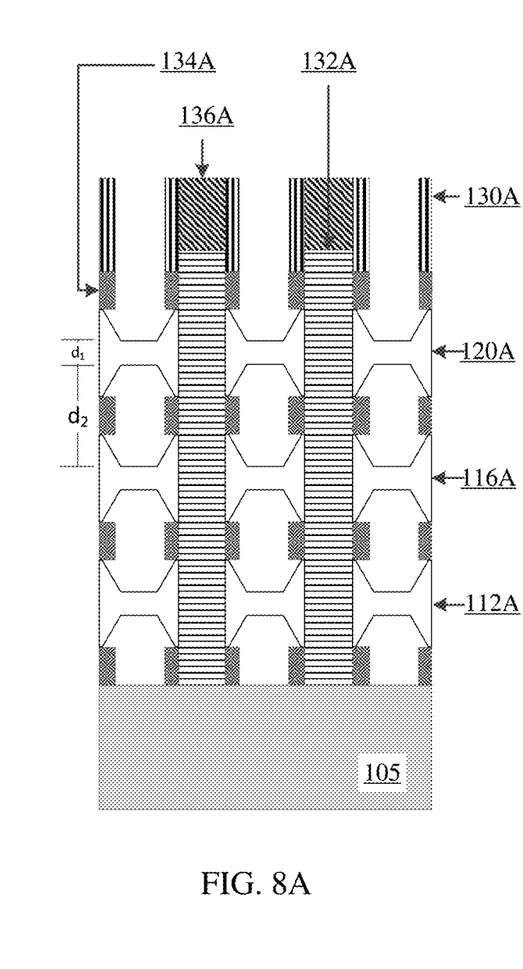
FIGS. 8A, 8B, and 8C each illustrate a different cross section of the devices on the same substrate during a fabrication stage, in accordance with an embodiment of the present invention.
Figure 8B:
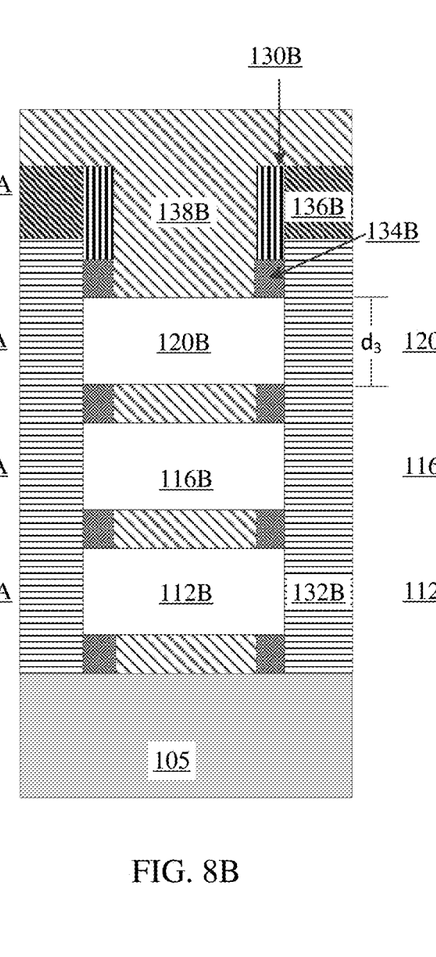
Figure 8C:
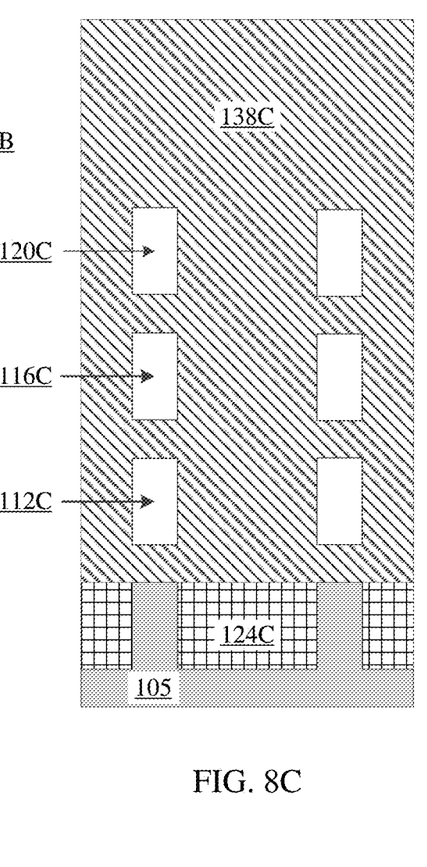

FIGS. 8A, 8B, and 8C each illustrate a different cross section of the devices on the same substrate during a fabrication stage, in accordance with an embodiment of the present invention. FIGS. 8A, 8B, and 8C illustrate a patterning process where a litho mask is used to open the thin gate oxide nanosheet devices 100 for Si thinning process. FIG. 8C illustrates a OPL 138C being formed on the exposed surfaces of the substrate 105 and the trench filler 124C. The OPL 138C encloses each of the second layer 112C, the fourth layer 116C, and the sixth layer 120C. FIG. 8B illustrates that the OPL 138B is formed in the gaps that came from the removal of the first layer 110B, the third layer 114B, the fifth layer 118B, and the seventh layer 122B. The OPL 138B is formed on top of the spacer 130B and the dielectric layer 136B. The OPL 138B, 138C protects the second layer 112B, 112C, the fourth layer 116B, 116C, and the sixth layer 120B, 120C from being damage/thinned during the thinning of the second layer 112A, the fourth layer 116A, and the sixth layer 120A. FIG. 8A illustrates the results of the isotropic etching/thinning of the second layer 112A, the fourth layer 116A, and the sixth layer 120A. The trimming of the layers causes the thickness of the second layer 112A, the fourth layer 116A, and the sixth layer 120A to be reduced around the center section of each of the layers. The second spacer 134A causes the edges of the second layer 112A, the fourth layer 116A, and the sixth layer 120A to be trimmed at a slower rate than the center section of the layers. The trimming causes a portion of the top and bottom surfaces of the second spacer 134A to be exposed. The center section of the second layer 112A, the fourth layer 116A, and the sixth layer 120A has a thickness of $d_1$. Therefore, the trimming process causes the second layer 112A, the fourth layer 116A, and the sixth layer 120A to have a varying thickness across the horizontal axis of the layers. The second layer 112A, the fourth layer 116A, and the sixth layer 120A have a thicker portion towards the edges and a thinner portion towards the center of the horizontal axis of the layers. The trimming of the layers causes the space between the center sections (distance $d_2$) of the second layer 112A, the fourth layer 116A, and the sixth layer 120A to be increased. The thickness $d_1$ is less than the distances $d_2$. The second layer 112B, 112C, the fourth layer 116B, 116C, and the sixth layer 120B, 120C have a thickness $d_3$. The second layer 112B, 112C, the fourth layer 116B, 116C, and the sixth layer 120B, 120C have a constant thickness $d_3$ across the horizontal of the layers. The thickness $d_3$ is larger than the thickness $d_1$.

Figure 9A:
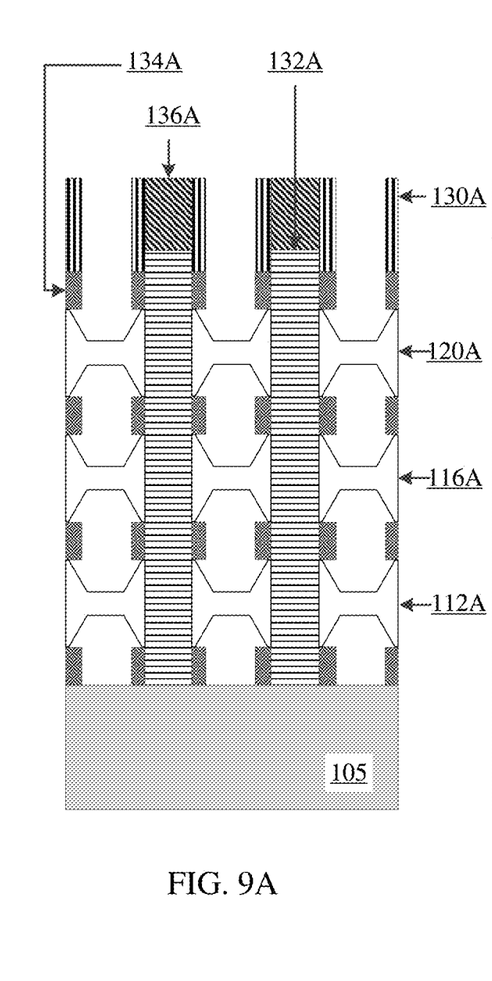
FIGS. 9A, 9B, and 9C each illustrate a different cross section of the devices on the same substrate during a fabrication stage, in accordance with an embodiment of the present invention.
Figure 9B:
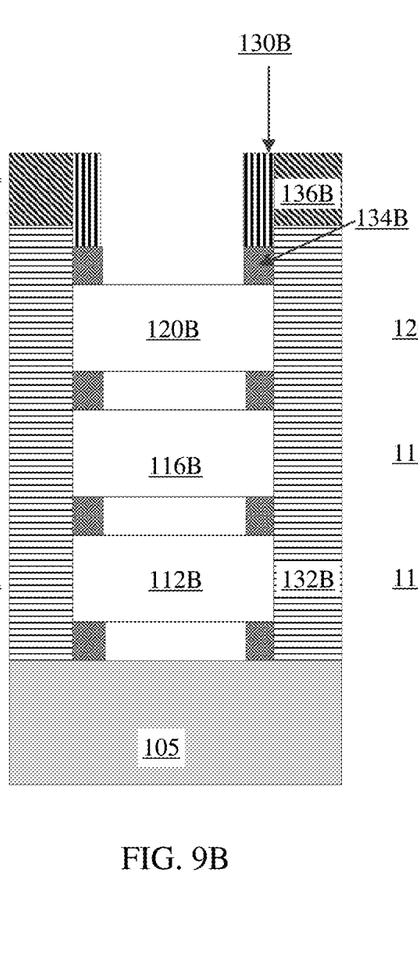
Figure 9C:
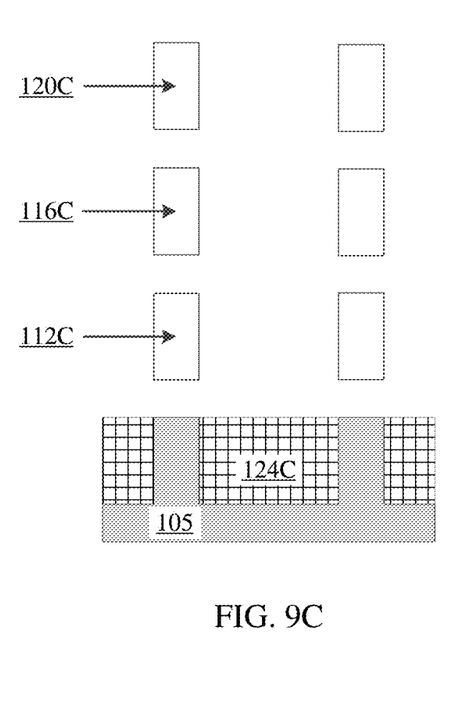

FIGS. 9A, 9B, and 9C each illustrate a different cross section of the devices on the same substrate during a fabrication stage, in accordance with an embodiment of the present invention. FIGS. 9A, 9B and 9C illustrate the removal of the OPL 138B, 138C from the surfaces of devices.

Figure 10A:
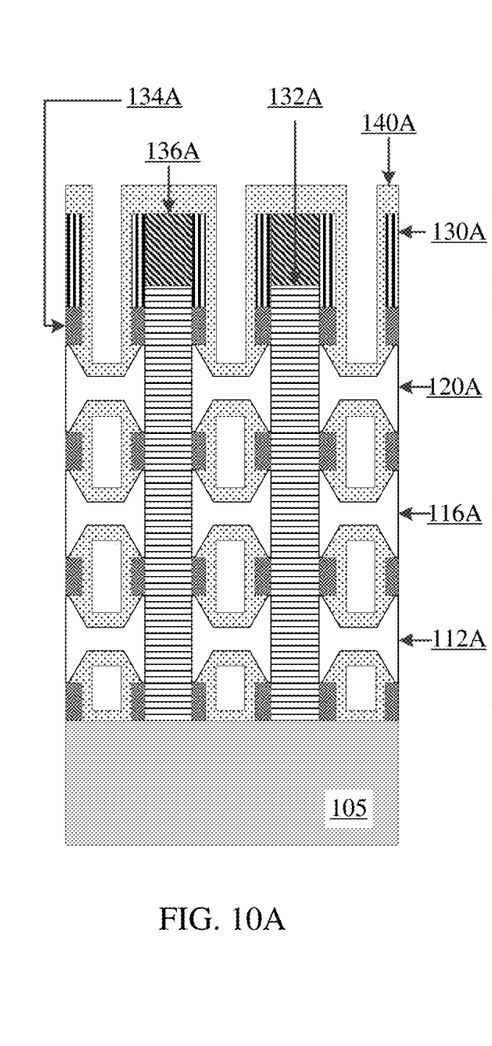
FIGS. 10A, 10B, and 10C each illustrate a different cross section of the devices on the same substrate during a fabrication stage, in accordance with an embodiment of the present invention.
Figure 10B:
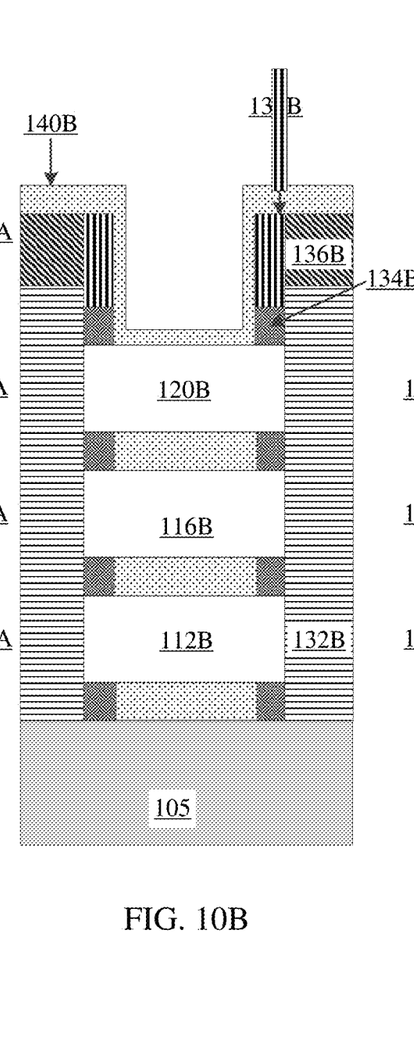
Figure 10C:
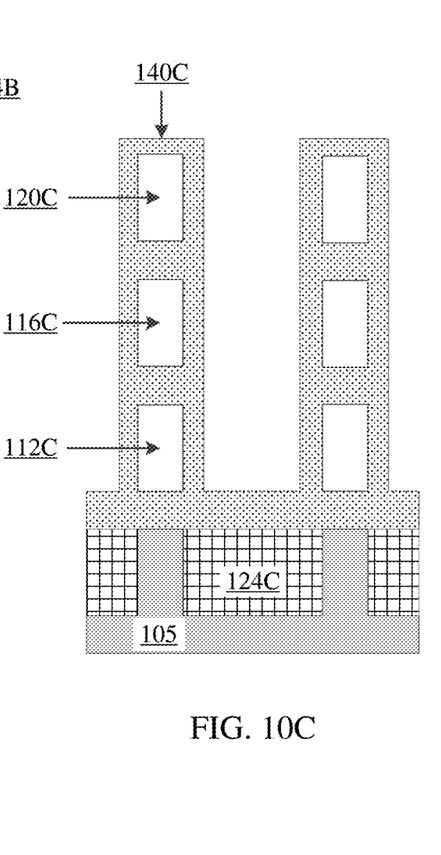

FIGS. 10A, 10B, and 10C each illustrate a different cross section of the devices on the same substrate during a fabrication stage, in accordance with an embodiment of the present invention. FIG. 10C illustrates an oxide layer 140C being formed on top of the substrate 105 and on top of the trench filler 124C. The oxide layer 140C encloses the second layer 112C, the fourth layer 116C, and the sixth layer 120C. The oxide layer 140C pinches off (i.e., fills) the space between the substrate 105, the second layer 112C, the fourth layer 116C, and the sixth layer 120C. FIG. 10B illustrates the oxide layer 140B filling the space between the substrate 105, the second layer 112B, the fourth layer 116B, and the sixth layer 120B. Furthermore, the oxide layer 140B is formed on the exposed surfaces of the dielectric layer 136B, the spacer 130B, the second spacer 134B, and on top of the sixth layer 120B. FIG. 10A illustrates the oxide layer 140A formed on the exposed surfaces of the substrate 105, the second layer 112B, the fourth layer 116B, the sixth layer 120B, and the second spacer 134A. The oxide layer 140A does not fill/pinch off the space between the substrate 105, the second layer 112A, the fourth layer 116A, and the sixth layer 120A. The oxide layer 140A is formed on the exposed surfaces of the second spacer 134A, such that a portion of the oxide layer 140A is sandwiched between the second spacer 134A and another surface of the substrate 105, the second layer 112A, the fourth layer 116A, or the sixth layer 120A. The oxide layer 140A is formed on the exposed surfaces of the dielectric layer 136A, the spacer 130A, the second spacer 134A, and on top of the sixth layer 120A.

Figure 11A:
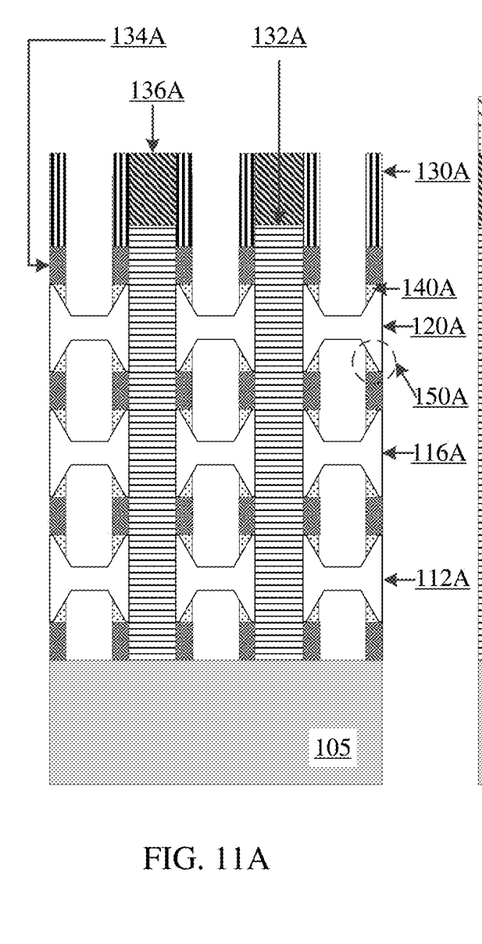
FIGS. 11A, 11B, and 11C each illustrate a different cross section of the devices on the same substrate during a fabrication stage, in accordance with an embodiment of the present invention.
Figure 11B:
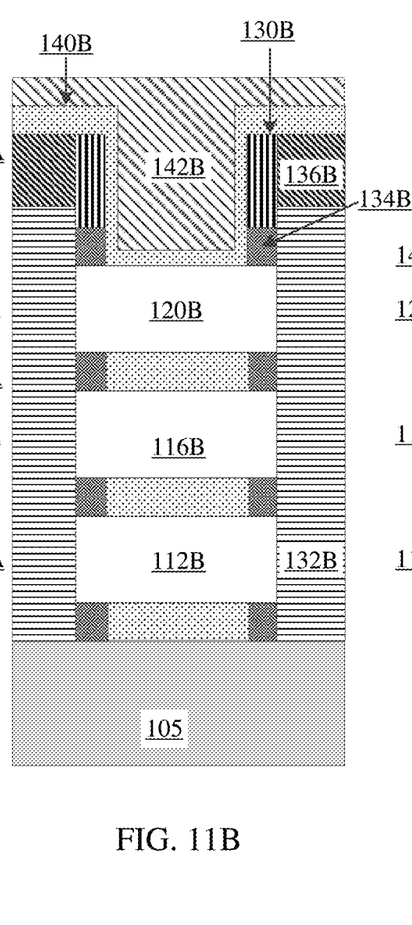
Figure 11C:
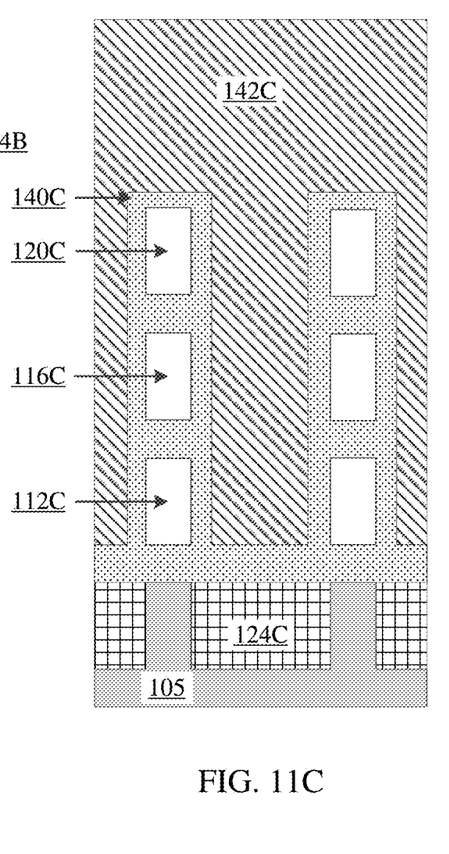

FIGS. 11A, 11B, and 11C each illustrate a different cross section of the devices on the same substrate during a fabrication stage, in accordance with an embodiment of the present invention. FIGS. 11A, 11B and 11B shows a patterning process where the thin gate oxide nanosheet device 100 region is opened again by utilizing an isotropic oxide etching back process. As illustrated by FIG. 11C, an OPL layer 142C is formed on the exposed surface of the oxide layer 140C. As illustrated by FIG. 11B, an OPL layer 142B is formed on the top surface of the oxide layer 140B located on the top of the dielectric layer 136B, the spacer 130B, and the top of the sixth layer 120B. The OPL layer 142C, 142B prevents the oxide layer 140C, 140B from being removed during the etching of the oxide layer 140A. The oxide layer 140A is removed by an etching process, however, the second spacer 134A protects a portion of the oxide layer 140A that is sandwiched between the second spacer 134A and the layer located above or below the second spacer 134A. As illustrated by FIG. 11A the oxide layer 140A is mostly removed, but a portion of the oxide layer 140A remains. As illustrated by the dashed circle 150A, the remaining oxide layer 140A is located between the second spacer 134A and the layer located above or below the second spacer 134A. The dashed circle 150A emphasizes the remaining oxide layer 140A located between the second spacer 134A and the sixth layer 120A.

Figure 12A:
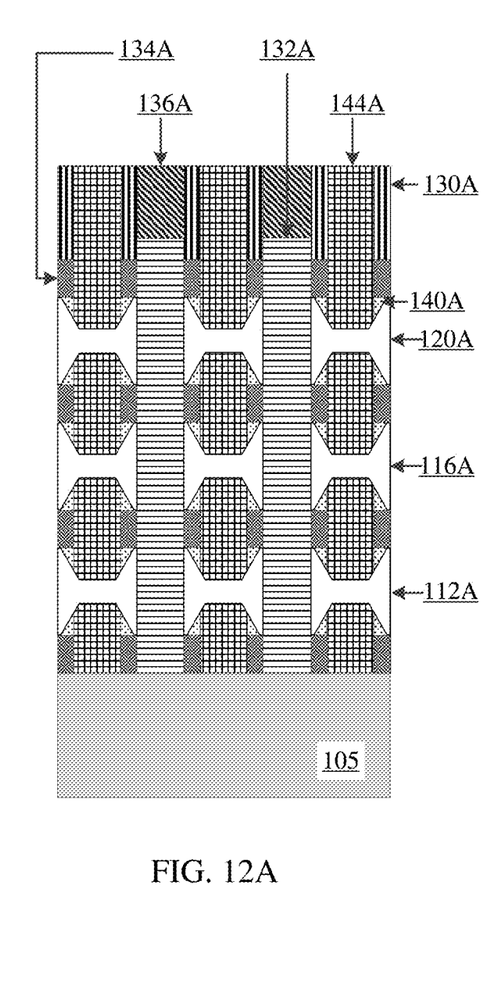
FIGS. 12A, 12B, and 12C each illustrate a different cross section of the devices on the same substrate during a fabrication stage, in accordance with an embodiment of the present invention.
Figure 12B:
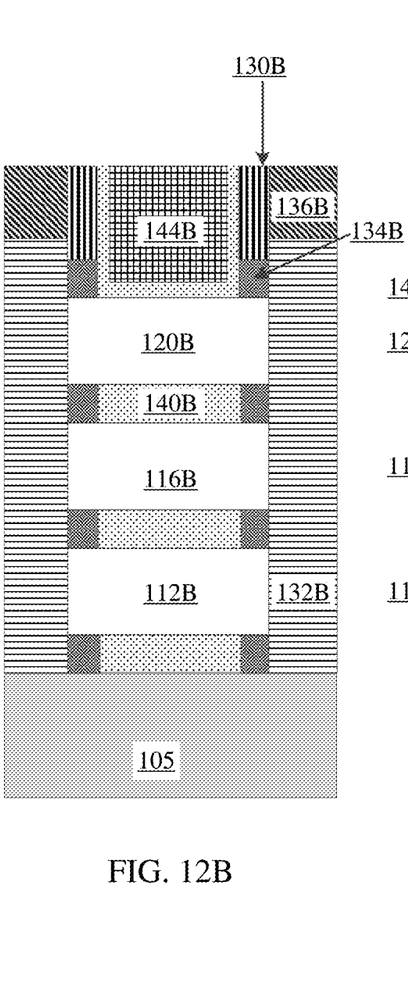
Figure 12C:
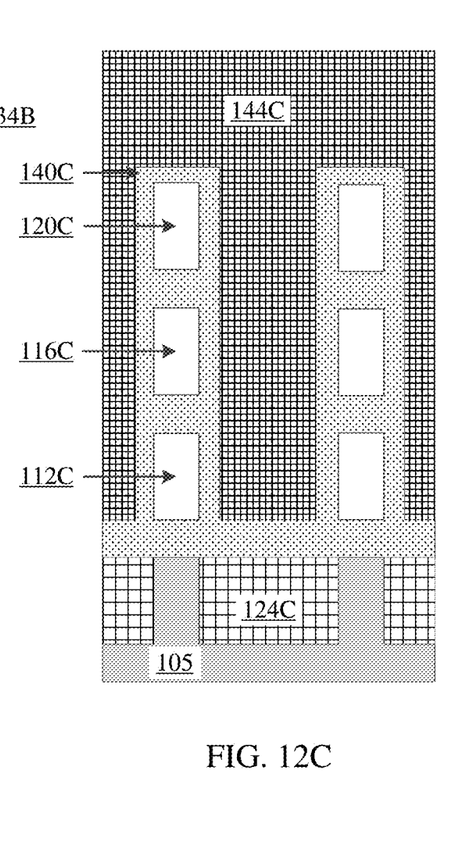

FIGS. 12A, 12B, and 12C each illustrate a different cross section of the devices on the same substrate during a fabrication stage, in accordance with an embodiment of the present invention. FIG. 12C illustrates the OPL layer 142C was removed and was replaced with a high K metal gate 144C. The high K metal gate 144C is formed on top of the oxide layer 140C. As illustrated by FIG. 12B, the OPL layer 142B was removed and was replaced with a high K metal gate 144B. The high K metal gate 144B is planarized to expose the top surface of the dielectric layer 136B, the spacer 130B, and the top surface of a portion of the oxide layer 140B. FIG. 12A illustrates the high K metal gate 144A formed in the space within each of the columns. The high K metal gate 144A fills the space between the substrate 105, the second layer 112A, fourth layer 116A, and the sixth 120A. The high K metal gate 144A fills the space on top of the sixth layer 120A between the spacers 130A.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
   a substrate;
   a thin gate oxide nanosheet device located on the substrate, having a first plurality of nanosheet layers, wherein each of the first plurality of nanosheet layers has a first thickness located at the center of each of the first plurality of nanosheet layers;
   a first spacer layer in contact with each of the first plurality of nanosheet layers;
   a first oxide layer located above and below each of the first plurality of nanosheet layers, wherein the first oxide layer is in direct contact with each of the plurality of first nanosheet layers; and
   a thick gate oxide nanosheet device located on the substrate, having a second plurality of nanosheet layers, wherein each of the second plurality of nanosheet layers has a second thickness located at the center of each of the second plurality of nanosheet layers;
   wherein the first thickness is less than the second thickness.

2. The apparatus of claim 1, wherein the side edges of each of the first plurality of nanosheet layers has a thickness larger than the first thickness for each of the first plurality of nanosheet layers, respectively.

3. The apparatus of claim 2, wherein the first spacer layer is located below and above side edges of each of the first plurality of nanosheet layers.

4. The apparatus of claim 3, wherein the first oxide layer is located between the first spacer layer and one of the first plurality of nanosheet layers located above and below the first spacer layer.

5. The apparatus of claim 4, further comprising:
   a metal gate located above and below each of the first plurality of nanosheet layers.

6. The apparatus of claim 5, wherein portions of the metal gate contacts the first oxide layer.

7. The apparatus of claim 1, wherein the thick gate oxide nanosheet device is comprised of:
   a second oxide layer located between each of the second plurality of nanosheet layers and the substrate.

8. The apparatus of claim 7, wherein the second oxide layer pinches off space between each of the of the second plurality of nanosheet layers and the substrate.

9. The apparatus of claim 1, wherein each of the first plurality of nanosheet layers is in contact with an oxide layer, a spacer layer, and a metal gate layer.

10. A semiconductor apparatus comprised of
    a substrate having a thin gate oxide nanosheet device and thick gate oxide nanosheet device located thereon;
    wherein the thin gate oxide nanosheet device is comprised of:
      a plurality of first nanosheet layers, wherein each of the plurality of first nanosheet layers have a varying thickness along the horizontal axis of the plurality of first nanosheet layers, wherein a thinnest section of each of the plurality of first nanosheet layers is located at the center of each of the plurality of first nanosheet layers;
      a first spacer layer in contact with each of the first plurality of nanosheet layers;
      a first oxide layer located above and below each of the first plurality of nanosheet layers, wherein the first oxide layer is in direct contact with each of the plurality of first nanosheet layers;
    wherein the thick gate oxide nanosheet device is comprised of:
      a plurality of second nanosheet layers, wherein each of the plurality of second nanosheets has a constant thickness;
    wherein the constant thickness of each of the plurality of second nanosheets is greater than the thinnest section of each of the plurality of first nanosheet layers.

11. The semiconductor apparatus of claim 10, wherein the first oxide layer pinches off space between each of the plurality of second nanosheet layers, and the first oxide layer pinches off space between the substrate and one of the plurality of second nanosheet layers.

12. The semiconductor apparatus of claim 10, wherein the thickest section of each of the plurality of first nanosheet layers is located at the edge of each first nanosheet layer.

13. The semiconductor apparatus of claim 12, wherein the first spacer layer is located below and above the edges of each of the first plurality of nanosheet layers.

14. The semiconductor apparatus of claim 13, further comprising:
    a second oxide layer is located between the first spacer layer and one of the first plurality of nanosheet layers located above and/or below the first spacer layer.

15. The semiconductor apparatus of claim 14, further comprising:
    a metal gate located above and below each of the first plurality of nanosheet layers.

16. A method comprising:
    forming a nanosheet stack on a substrate, wherein the nanosheet stack is comprised of a plurality of alternating layers of Si and SiGe 30%;
    processing a first portion of the alternating layers of Si and SiGe 30% to form a thick gate oxide nanosheet device;
    processing a second portion of the alternating layers of Si and SiGe 30% to form a thin gate oxide nanosheet device, wherein forming thin gate oxide nanosheet device comprises thinning each Si layer of the second portion of the nanosheet stack, wherein each thinned layer of Si has a varying thickness across the horizontal axis, wherein the thinnest section of each layer of Si is located at the center of the horizontal axis for each layer of Si;
    forming a spacer layer in contact with each of the layers of Si of the thin gate device; and
    forming an oxide layer in contact with each of the layers of Si of the thin gate device.

17. The method of claim 16, wherein the spacer layer is located at the edge of each layer of Si, wherein the spacer layer is formed on the top and bottom of each layer of Si.

* * * * *